United States Patent
Shimbo (10) Patent No.: US 9,871,040 B2
(45) Date of Patent: Jan. 16, 2018

(54) SEMICONDUCTOR DEVICE COMPRISING A STANDARD CELL

(71) Applicant: SOCIONEXT INC., Yokohama-shi, Kanagawa (JP)

(72) Inventor: Hiroyuki Shimbo, Kyoto (JP)

(73) Assignee: SOCIONEXT INC., Kanagawa (JP)

( * ) Notice: Subject to any disclaimer, the term of this patent is extended or adjusted under 35 U.S.C. 154(b) by 29 days.

(21) Appl. No.: 15/059,974

(22) Filed: Mar. 3, 2016

(65) Prior Publication Data

US 2016/0190138 A1   Jun. 30, 2016

Related U.S. Application Data

(63) Continuation of application No. PCT/JP2014/002206, filed on Apr. 18, 2014.

(30) Foreign Application Priority Data

Sep. 4, 2013   (JP) .................... 2013-183350

(51) Int. Cl.
*H01L 21/70* (2006.01)
*H01L 27/092* (2006.01)
(Continued)

(52) U.S. Cl.
CPC ...... *H01L 27/0924* (2013.01); *H01L 27/0207* (2013.01); *H01L 27/0629* (2013.01);
(Continued)

(58) Field of Classification Search
CPC ............ H01L 27/0207; H01L 27/0629; H01L 27/0886; H01L 27/0924; H01L 27/0676; H01L 29/6681
See application file for complete search history.

(56) References Cited

U.S. PATENT DOCUMENTS

| 8,258,577 | B2 | 9/2012 | Dixit |
| 2009/0230483 | A1 | 9/2009 | Mizumura et al. |

(Continued)

FOREIGN PATENT DOCUMENTS

| JP | 2009-218499 A | 9/2009 |
| JP | 2010-016258 A | 1/2010 |

(Continued)

OTHER PUBLICATIONS

International Search Report issued in Application No. PCT/JP2014/002206 dated May 20, 2014, with English translation.
(Continued)

*Primary Examiner* — Khiem D Nguyen
(74) *Attorney, Agent, or Firm* — McDermott Will & Emery LLP (57) ABSTRACT

Disclosed herein is a semiconductor device including two standard cells which are arranged adjacent to each other in an X direction. One of the two standard cells includes a plurality of first fins which extend in the X direction, and which are arranged along a boundary between the two standard cells in a Y direction. The other standard cell includes a plurality of second fins which extend in the X direction, and which are arranged along the boundary between the two standard cells in the Y direction. The plurality of second fins includes a dummy fin.

8 Claims, 11 Drawing Sheets

(51) Int. Cl.
  *H01L 27/02* (2006.01)
  *H01L 27/06* (2006.01)
  *H01L 27/088* (2006.01)
  *H01L 29/66* (2006.01)

(52) U.S. Cl.
  CPC ...... *H01L 27/0676* (2013.01); *H01L 27/0886* (2013.01); *H01L 29/6681* (2013.01)

(56) References Cited

U.S. PATENT DOCUMENTS

| | | | |
|---|---|---|---|
| 2010/0025767 A1 | 2/2010 | Inaba | |
| 2010/0187699 A1 | 7/2010 | Nishimura et al. | |
| 2011/0133285 A1* | 6/2011 | Liaw | H01L 27/0207 257/368 |
| 2011/0186932 A1 | 8/2011 | Mizumura et al. | |
| 2011/0298025 A1* | 12/2011 | Haensch | H01L 21/823431 257/296 |
| 2012/0168875 A1 | 7/2012 | Tamaru et al. | |
| 2012/0193722 A1 | 8/2012 | Inaba | |
| 2013/0148409 A1* | 6/2013 | Chung | H01L 27/1211 365/148 |
| 2013/0277760 A1* | 10/2013 | Lu | H01L 29/10 257/401 |

FOREIGN PATENT DOCUMENTS

| | | |
|---|---|---|
| JP | 2010-040630 A | 2/2010 |
| WO | 2008/059440 A2 | 5/2008 |
| WO | 2011/077664 A1 | 6/2011 |

OTHER PUBLICATIONS

Written Opinion issued in Application No. PCT/JP2014/002206 dated May 20, 2014, with partial English translation.

* cited by examiner

SEMICONDUCTOR DEVICE COMPRISING A STANDARD CELL

CROSS-REFERENCE TO RELATED APPLICATIONS

This is a continuation of International Application No. PCT/JP2014/002206 filed on Apr. 18, 2014, which claims priority to Japanese Patent Application No. 2013-183350 filed on Sep. 4, 2013. The entire disclosures of these applications are hereby incorporated by reference.

BACKGROUND

The present disclosure relates to a semiconductor device, and in particular, to a semiconductor integrated circuit having a layout designed by a standard cell design method.

A standard cell design has been known as a method of forming a semiconductor integrated circuit on a semiconductor substrate. The standard cell design refers to a method of designing a large-scale integrated circuit (LSI) chip by providing in advance, as standard logic cells, unit logic elements having particular logic functions (for example, an inverter, a latch, a flip-flop, and a full adder), laying out those standard logic cells on a semiconductor substrate, and connecting those standard logic cells together with metallic interconnects.

Figure 11:
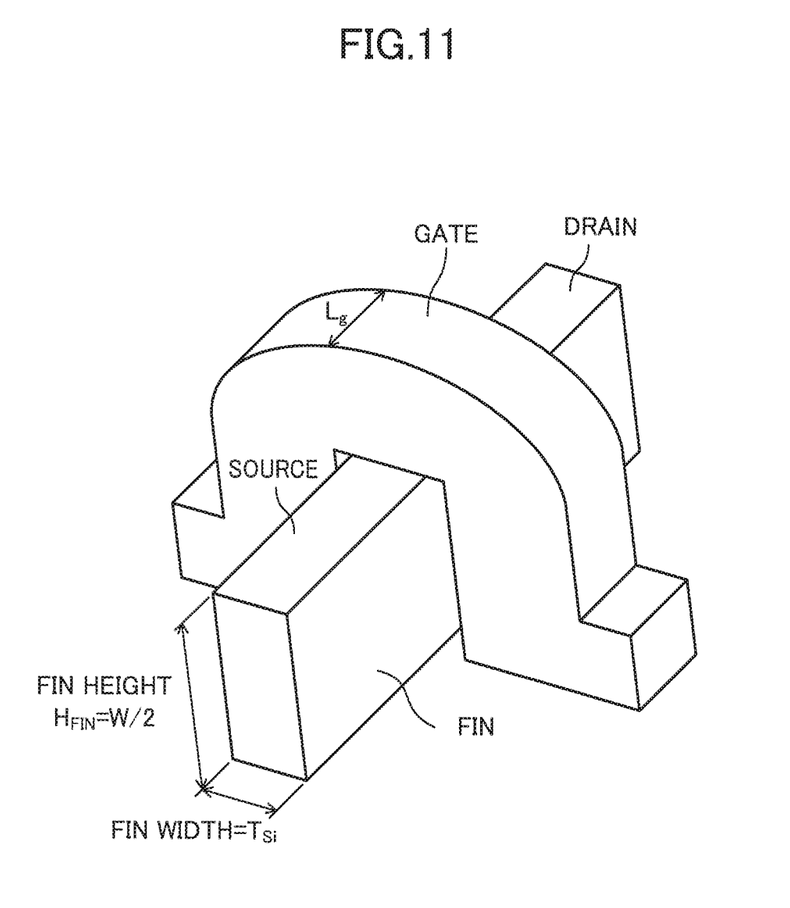
FIG. 11 illustrates the structure of a fin transistor.

FIG. 11 illustrates the structure of a fin transistor. Unlike a conventional complementary metal-oxide semiconductor (CMOS) transistor having two-dimensional structure, the source and drain of this fin transistor have a raised, three-dimensional structure called "fin." The fin transistor's gate is disposed perpendicularly to this fin such that the gate wraps around a channel region defined between the source and drain in this fin. By forming the transistor with such a structure, its channel region may be controlled on three surfaces on which the gate and the fin are in contact with each other, thereby improving the channel controllability significantly compared to the conventional transistor where the channel region is controlled on a single plane only. As a result, various advantages, including reducing the leakage power, increasing the ON-state current, and lowering the operating voltage, are achieved in a semiconductor integrated circuit including such a fin transistor.

U.S. Pat. No. 8,258,577 discloses a technique for forming a standard cell using fin transistors.

SUMMARY

On the other hand, a fin transistor has its characteristic affected more significantly by the distance to an adjacent transistor than a conventional CMOS transistor having a two-dimensional structure does. Specifically, in addition to current characteristic variations due to the OD-spacing-effect (OSE) which have also been observed in the conventional transistor, variations in current characteristics and capacitance characteristics are also caused in the fin transistors by, for example, physical stress or the interval between fins which stand perpendicularly to the Si surface.

The position of the fin varies from one standard cell to another, depending on the logic and driving force of the standard cell. Therefore, if two standard cells each including the fin transistors are arranged adjacent to each other in the lateral direction, the interval between the two fins that are adjacent to each other with the boundary between the two standard cells interposed therebetween may vary depending on types of the adjacent cells. This causes a variation in characteristic between the fin transistors, which results in a variation in the performance of the semiconductor device including these standard cells.

If a standard cell is not adjacent to another standard cell in the lateral direction (for example, if the standard cell is arranged close to the right or left end of a circuit block), there may be no fins adjacent to the fins that are arranged along, and inside, the right or left end of the standard cell. In such a case, the interval between the fins may be substantially infinity.

A possible way to deal with such a variation in the interval between the fins is to allow, in advance, a certain margin to the capacitance and current characteristics of the circuits (respective transistors) at the stage of designing. This, however, may cause a deterioration in the performance, and an increase in the overall cost, of a semiconductor device including the standard cells.

In view of the foregoing, it is therefore an object of the present disclosure to improve the performance of a semiconductor device comprised of standard cells, each including fin transistors, by reducing such variations in characteristic (for example, variations in current and capacitance characteristics) which are caused by a difference in type between laterally adjacent ones of the standard cells.

A first aspect of the present disclosure is directed to a semiconductor device comprising first and second standard cells which are arranged adjacent to each other in a first direction and which each include a fin transistor. The first standard cell includes a plurality of first fins which extend in the first direction, and which are arranged along a boundary between the first and second standard cells in a second direction that is perpendicular to the first direction. The second standard cell includes a plurality of second fins which extend in the first direction, and which are arranged in the second direction along the boundary between the first and second standard cells such that each of the second fins is aligned with an associated one of the first fins, and at least one active fin. At least one of the plurality of second fins is at least one dummy fin which does not contribute to any logical function.

According to the first aspect, the plurality of first fins and the plurality of second fins are arranged adjacent to each other with the boundary between the first and second standard cells interposed therebetween such that each of the first fins is aligned with an associated one of the second fins. Any one of these second fins is at least one dummy fin. Consequently, the distance between the first fins of the first standard cell and the second fins of the second standard cell that are adjacent to the first fins with the boundary between the standard cells interposed therebetween may be defined uniquely, irrespective of the types of the first and second standard cells. This allows for reducing the variation to be caused in the performance of the semiconductor device due to a difference in type between the adjacent standard cells.

A second aspect of the present disclosure is directed to a semiconductor device comprising a standard cell including a fin transistor. The standard cell further includes a plurality of first active fins which extend in a first direction, and which are arranged in a second direction that is perpendicular to the first direction along one end of the standard cell in the first direction. The standard cell further includes a plurality of second active fins which extend in the first direction, and which are arranged in the second direction along the other end of the standard cell in the first direction. The standard cell further includes two regions having two different conductivity types which are arranged adjacent to each other in the second direction. The first active fins and the second active fins are arranged in both the two regions having the two different conductivity types. In one of the two regions that has one of the two conductivity types, a third active fin is arranged between at least one pair of the first and second active fins, and in the other region that has the other conductivity type, no active fins are arranged at the same position as the third fin in the first direction.

According to the second aspect, the plurality of first active fins and the plurality of second active fins are arranged in the second direction along both ends of the standard cell in the first direction. That is to say, the active fins are preferentially arranged along both ends of the standard cell in the first direction. On the other hand, in one of the two regions having two different conductivity types, a non-active fin area (i.e., an area where fins may be arranged but no active fins are arranged) is defined inside the active fins arranged along both ends. Specifically, a non-active fin area may be formed in one of the two regions that has one conductivity type because of for example, the type of the standard cell or the capability (e.g., drive capability) of the respective transistors in the standard cell. More specifically, the total size of the transistors in that region of the one conductivity type may be smaller than that of the transistors in the other region of the other conductivity type. Even in these cases, the active fins are still preferentially arranged along both ends of the former region in the first direction. Thus, if a plurality of standard cells with such a configuration are arranged adjacent to each other in the first direction, the distance between the first active fins and the distance between the second active fins that are adjacent to each other with the boundary between the standard cells interposed therebetween may be defined uniquely, irrespective of the types of the adjacent standard cells. This allows for reducing a variation in characteristic to be caused due to a difference in type between the adjacent standard cells, and eventually improving the performance of the semiconductor device including the standard cells. In this regard, even if both of the two regions having two different conductivity types have a non-active fin area, it is recommended that the active fins be preferentially arranged along both ends in the first direction in both of the two regions having two different conductivity types.

A third aspect of the present disclosure is directed to semiconductor device comprising a standard cell including a fin transistor. The standard cell further includes, in a logical function area, a plurality of active fins which extend in a first direction, and which are arranged in a second direction that is perpendicular to the first direction. The standard cell further includes, between the logical function area and one end of the standard cell in the first direction, a plurality of first dummy fins which extend in the first direction and, which are arranged in the second direction such that each of the first dummy fins is aligned an associated one of the active fins.

According to the third aspect, for each of the active fins, an associated one of the first dummy fin is provided closer to one end of the standard cell in the first direction. Therefore, irrespective of the type of a cell (for example, a standard cell) to be arranged adjacent to this end of the standard cell, or no matter whether such a cell is present or not, the distance between the active fins and the adjacent fins (e.g., the first dummy fins) is defined uniquely. This allows for reducing a variation in characteristic between active transistors in a logical function area, irrespective of the types of adjacent cells, and eventually improving the performance of a semiconductor device including the standard cells of this embodiment.

Thus, according to the present disclosure, in two adjacent standard cells, the distance between the fins of one standard cell that are arranged along the boundary between the adjacent cells and the fins of the other standard cell that are adjacent to the former fins with the boundary interposed therebetween is defined uniquely, irrespective of the types of the standard cells. This allows for reducing a variation in characteristic to be caused due to a difference in type between the adjacent standard cells, and eventually improving the performance of the semiconductor device including the standard cells.

DETAILED DESCRIPTION

Embodiments of the present disclosure will be described below in detail with reference to the drawings. In the following description of embodiments, each semiconductor integrated circuit device is supposed to include a plurality of standard cells, at least some of which is supposed to be comprised of fin transistors. Note that description of substantially the same configuration may be sometimes omitted herein.

In this specification, a transistor which contributes to a logical function of a standard cell will be hereinafter referred to as an "active transistor," whereas a transistor which does not contribute to any logical function of the standard cell will be hereinafter referred to as a "non-active transistor." A fin which forms part of the "active transistor" will be hereinafter referred to as an "active fin," whereas the fins other than the "active fins" will be hereinafter referred to as "dummy fins." In other words, the "dummy fin" hereinafter refers to either a fin which forms part of a "non-active transistor" or a fin which does not form part of any transistor. In the following description, unless otherwise specified, the terms "the vertical direction" and "the lateral direction" refer herein to the vertical direction on the paper and the lateral direction on the paper, respectively.

First Embodiment

Figure 1:
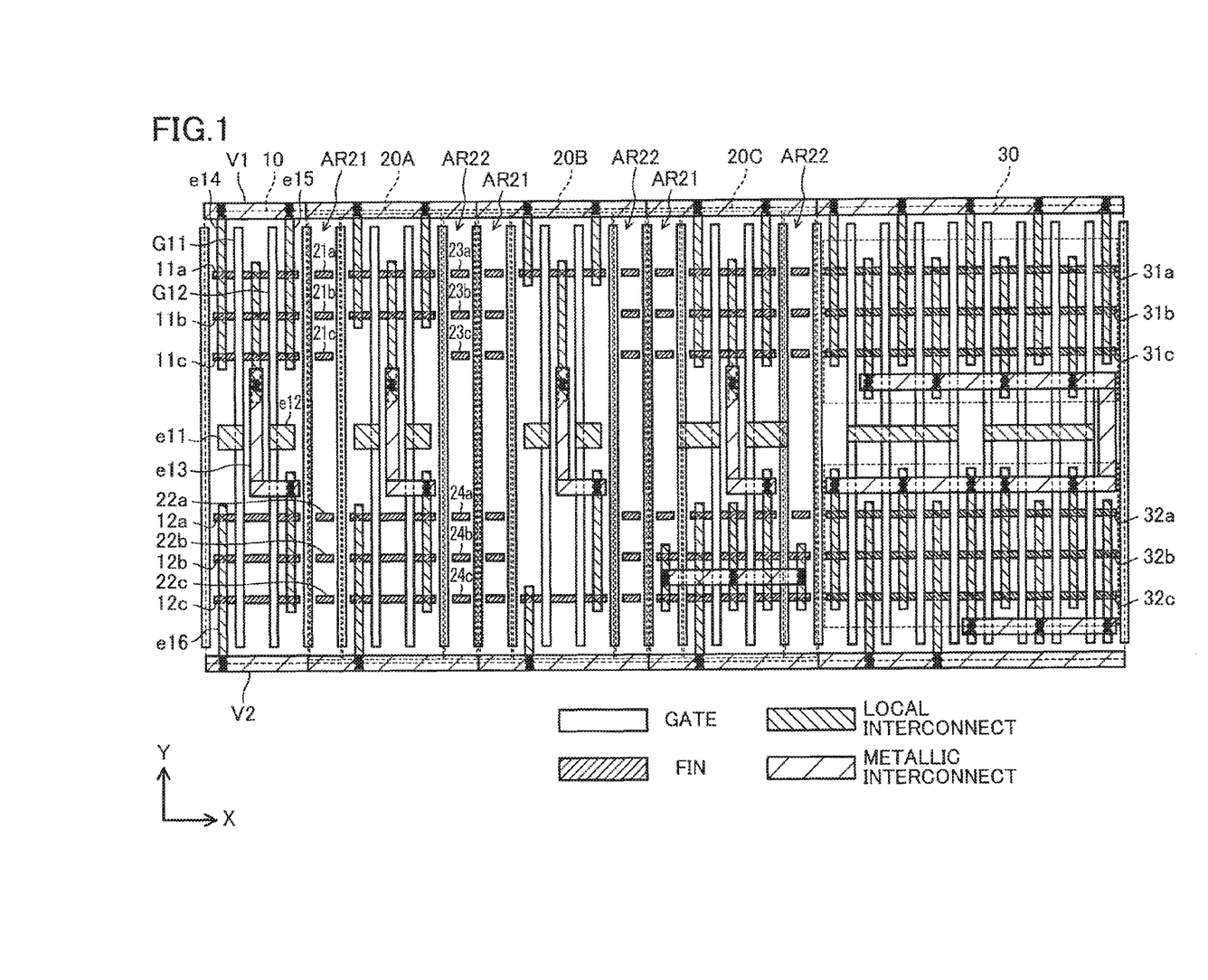
FIG. 1 is a plan view showing an exemplary layout design in which a plurality of standard cells for use in a semiconductor device of a first embodiment are arranged adjacent to each other.

FIG. 1 is a plan view showing an exemplary layout design in which a plurality of standard cells for use in a semiconductor device according to a first embodiment are arranged adjacent to each other. Specifically, five standard cells 10, 20A, 20B, 20C, and 30, each including fin transistors, are arranged adjacent to each other in the lateral direction (X direction), which is an exemplary first direction. In FIG. 1 and the other plan views attached hereto, each fin transistor is comprised of a fin and a gate formed on the fin. Local interconnects are each formed so as to be located on a fin or a gate in a region in which the local interconnect overlaps with the fin or gate when viewed in plan, and is electrically connected to the fin or gate. Metallic interconnects are located over the local interconnects, and connected to the local interconnects through contacts. In FIG. 1, the fins are hatched to allow the reader to find the fins easily on the drawing. However, the fins are not hatched at their portions located under the gates. The gates and local interconnects are also hatched differently, and portions at which the metallic interconnects and local interconnects are connected together through contacts are indicated by the solid squares. The other plan views are illustrated in the same or similar manner.

Here, in FIG. 1, the vertical direction (Y direction) corresponds to an exemplary second direction of the standard cells 10, 20A, 20B, 20C, and 30. The maximum number of the fins which may be arranged (rendered) in the Y direction (i.e., the number of the fins arranged in the vertical direction) is set to be six. This is applicable also to the other plan views.

For the sake of convenience, in this exemplary embodiment, the standard cells 10, 20A, 20B, 20C, and 30 are all supposed to be implemented as two-input NAND cells. However, the present disclosure is not limited to this, and each cell may be of any other type (e.g., an inverter cell, an AND cell, an OR cell, a NOR cell, a composite cell, a flip-flop, etc.). This is applicable also to the other embodiments.

The standard cell 10 (first standard cell) includes a plurality of active fins (first fins) 11a, 11b, 11c, 12a, 12b, and 12c which extend from one end portion to the other end portion in the lateral direction, and which are arranged in the vertical direction. That is to say, the active fins 11a, 11b, 11c, 12a, 12b, and 12c are arranged in the vertical direction along the boundary between the standard cells 10 and 20A.

In the standard cell 10, gate lines G11 and G12 extend in the vertical direction, and are arranged side by side in the lateral direction such that the gate lines intersect, at right angles, with the active fins 11a, 11b, 11c, 12a, 12b, and 12c at an intermediate portion of each of these active fins. The gate line G11 is connected to an input line e11, through which an input signal A1 is applied to the gate line G11. Likewise, the gate line G12 is connected to an input line e12, through which an input signal B1 is applied to the gate line G12.

In the standard cell 10, an output line e13 through which an output signal Y1 is output is connected to the active fins 11a, 11b, and 11c, between the gate lines G11 and G12. Both end portions of each of the active fins 11a, 11b, and 11c in the lateral direction are connected to a power supply line (for example, a power supply) V1 via connection lines e14 and e15 which extend in the vertical direction. The output line e13 is also connected to one end portion of each of the active fins 12a, 12b, and 12c in the lateral direction. The other end portion of each of the active fins 12a, 12b, and 12c in the lateral direction is connected to a power supply line (for example, a ground) V2 via a connection line e16 which extends in the vertical direction.

Figure 2:
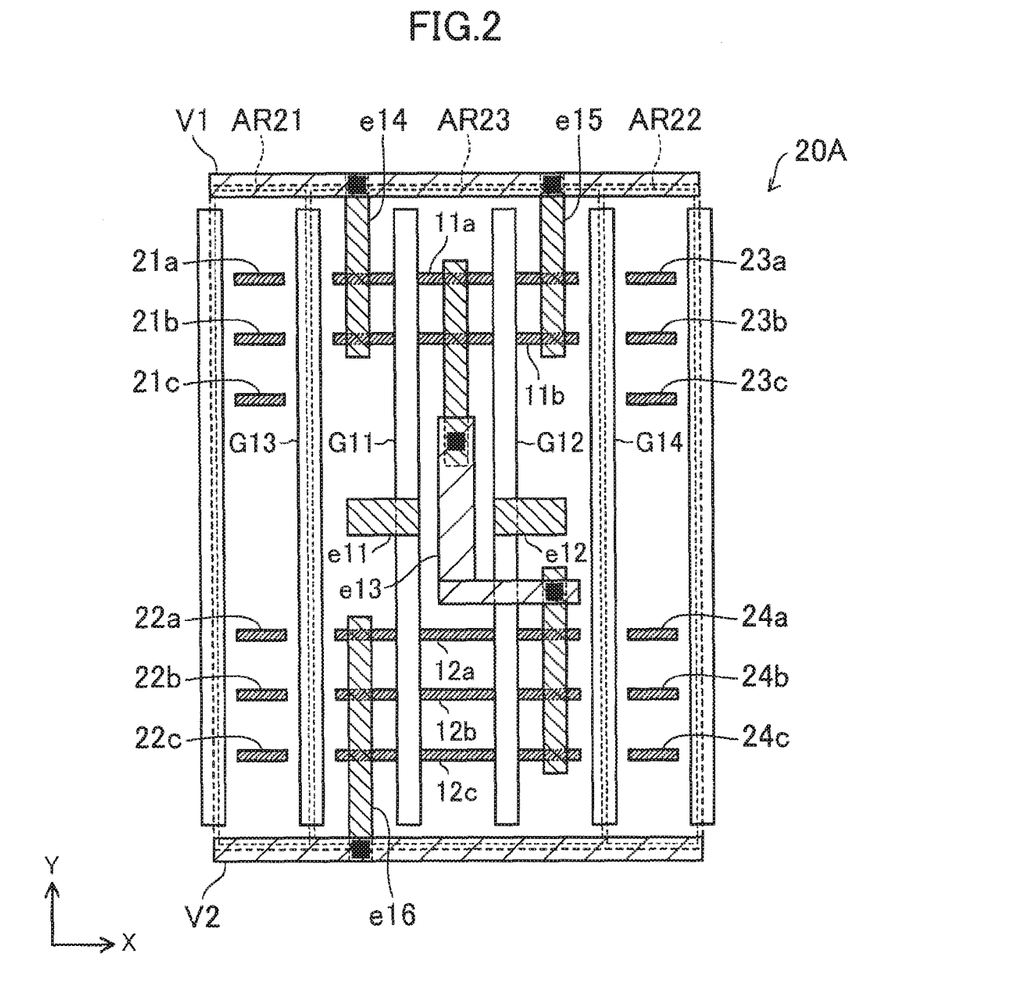
FIG. 2 is a plan view showing an exemplary layout design of a standard according to the first embodiment.

As shown in FIG. 2, the standard cell 20A (the second standard cell) includes a NAND cell arranged in its logical function area AR23. As used herein, the term "logical function area" refers to an area in which active transistors (active fins) which perform a logical function are arranged as in a NAND cell, for example. The NAND cell has a similar configuration to the standard cell 10, but has a different number of active fin in the upper portion thereof in the vertical direction. Specifically, the standard cell 10 shown in FIG. 1 has the three active fins 11a, 11b, and 11c, whereas the standard cell 20A shown in FIG. 2 has two active fins 11a and 11b.

The standard cell 20A includes, in an area (e.g., area AR21) between the logical function area AR23 and an end (i.e., the left end in this case) in the lateral direction, a plurality of dummy fins (second fins) 21a, 21b, 21c, 22a, 22b, and 22c which extend in the lateral direction and which are arranged in the vertical direction. These dummy fins are arranged at such positions as to be aligned with the active fins 11a, 11b, 11c, 12a, 12b, and 12c of the standard cell 10 (for example, such that each dummy fin of the standard cell 20A and the associated active fin of the standard cell 10 are located at substantially the same position in the vertical direction in a state where the cells 10 and 20A are arranged adjacent to each other). That is to say, the dummy fins 21a, 21b, 21c, 22a, 22b, and 22c are arranged in the vertical direction along the boundary between the standard cells 20A and 10. As used herein, if some pair of members are "local substantially at the same position in the vertical direction", those members may be slightly misaligned with each other with respect to the vertical direction due to some error involved with a design or manufacturing process, for example.

The standard cell 20A includes, in an area (e.g., area AR22) between the logical function area AR23 and the other end (i.e., the right end in this case) in the lateral direction, a plurality of dummy fins 23a, 23b, 23c, 24a, 24b, and 24c which extend in the lateral direction and which are arranged in the vertical direction. That is to say, the dummy fins 23a, 23b, 23c, 24a, 24b, and 24c are arranged in the vertical direction along the boundary between the standard cells 20B and 20A.

Figure 3:
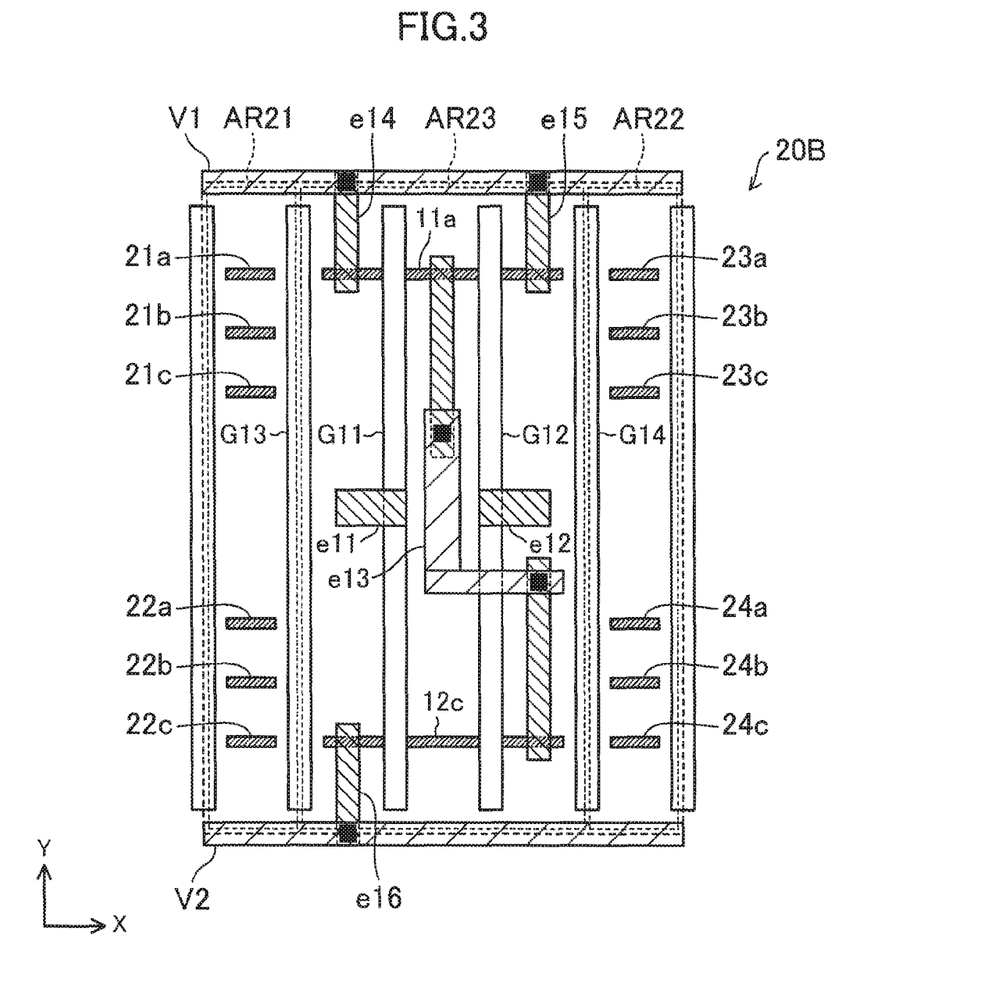
FIG. 3 is a plan view showing another exemplary layout design of a standard cell according to the first embodiment.

As shown in FIG. 3, the standard cell 20B includes a NAND cell arranged in its logical function area AR23. The NAND cell has a similar configuration to the standard 20A, but has a different number of the active fins in each of the upper and lower portions in the vertical direction. Specifically, the standard cell 20A shown in FIG. 2 has the two active fins 11a and 11b in its upper portion, whereas the standard cell 20B shown in FIG. 3 has one active fin 11a in its upper portion. Further, the standard cell 20A shown in FIG. 2 has the three active fins 12a, 12b, and 12c in its lower portion, whereas the NAND cell 20B shown in FIG. 3 has one active fin 12c in its lower portion.

Like the standard cell 20A, the standard cell 20B also includes a plurality of dummy fins 21a, 21b, 21c, 22a, 22b, and 22c which extend in the lateral direction and which are arranged in the vertical direction in its area AR21, and a plurality of dummy fin 23a, 23b, 23c, 24a, 24b, and 24c which extend in the lateral direction and which are arranged in the vertical direction in its area AR22.

As can be seen from the foregoing, the active fin 11c is omitted from the logical function area AR23 of each of the standard cells 20A and 20B. Therefore, for the dummy fin 23c of the standard cell 20A and the dummy fin 21c of the standard cell 20B that are laterally adjacent to each other with the boundary between the standard cells 20A and 20B interposed therebetween, there are no active fins inside the respective cells with respect to the lateral direction (i.e., in the respective logical function area AR23). In this case, the dummy fin 23c of the standard cell 20A and the dummy fin 21c of the standard cell 20B may be omitted.

On the other hand, in general, standard cells are designed prior to determining the entire layout of a circuit, and the designed cells are arranged as appropriate once the entire layout of the circuit is determined. Therefore, it is sometimes possible, at the time of designing a standard cell, to predict what type of cell will be arranged adjacent to the standard cell. To address this problem, as shown in FIG. 1, the maximum number of dummy fins may be arranged (or rendered), in advance, in the vertical direction in the standard cells 20A, 20B, and 20C. This would increase the user friendliness of the design process. In the standard cells 20A and 20B, the maximum number of the dummy fins that may be arranged (or rendered) are arranged in the vertical direction, as an example.

In the example described above, the fins arranged in the respective areas AR21 and AR22 of the standard cells 20A and 20B are all dummy fins. This is, however, merely an example. Alternatively, as in the standard cell 20C shown in FIG. 4, some of the fins arranged in the areas AR21 and AR22 may also be active fins.

Figure 4:
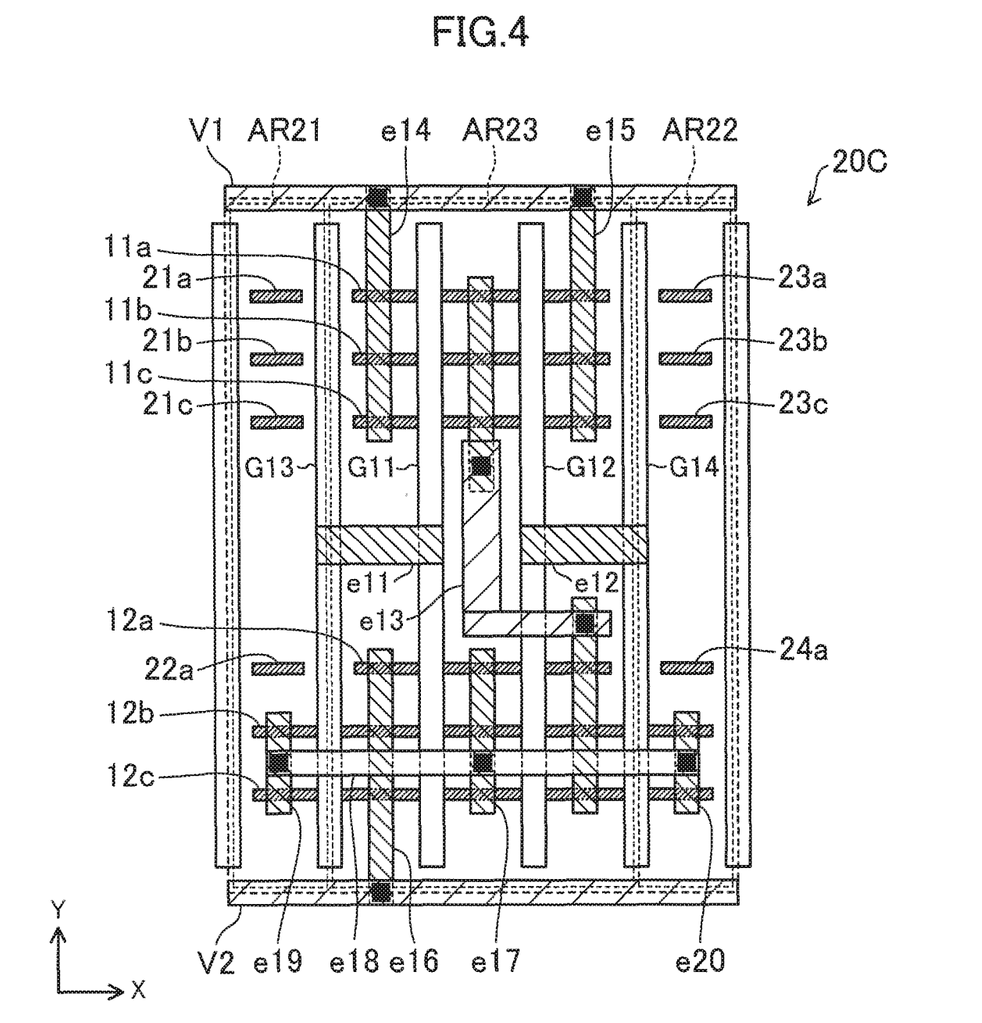
FIG. 4 is a plan view showing another exemplary layout design of a standard cell according to the first embodiment.

The standard cell 20C of FIG. 4 includes a NAND cell arranged in its logical function area AR23. Active fins 12b and 12c which form part of the NAND cell extend in the lateral direction, from an end portion to the other end portion of the standard cell 20C (i.e., from the area AR21 to the area AR22 via the logical function area AR23).

In the standard cell 20C, a gate line G13 is arranged to extend on the boundary between the area AR21 and the logical function area AR23 in the vertical direction. A gate line G14 is arranged to extend on the boundary between the area AR22 and the logical function area AR23 in the vertical direction. That is to say, the active fins 12b and 12c intersect with the four gate lines G11, G12, G13, and G14 at right angles. The gate lines G11 and G13 are connected to an input line e11, through which an input signal A1 is applied to the gate lines G11 and G13. Likewise, the gate lines G12 and G14 are connected to an input line e12, through which an input signal B1 is applied to the gate lines G12 and G14.

In the standard cell 20C, the active fins 12a, 12b, and 12c are connected to each other at their portions located between the gate lines G11 and G12 via a connection line e17 which extends in the vertical direction. The connection line e17 is connected to one end of each of the active fins 12b and 12c located in the area AR 21 via a connection line e18 which extends in the lateral direction and a connection line e19 which extends in the vertical direction in the area AR21. Further, the connection line e17 is connected to the other end of each of the active fins 12b and 12c located in the area AR 22 via a connection line e18 which extends in the lateral direction and a connection line e20 which extends in the vertical direction in the area AR22. The active fins 12a, 12b, and 12c are connected to a power supply line V2 at their respective portions located between the gate lines G13 and G11 via a connection line e16 which extends in the vertical direction.

The standard cell 20C includes a plurality of dummy fins 21a, 21b, 21c, and 22a which extend in the lateral direction and which are arranged in the vertical direction in its area AR21, and a plurality of dummy fins 23a, 23b, 23c, and 24a which extend in the lateral direction and which are arranged in the vertical direction in its area AR22. That is to say, as compared to the standard cells 20A and 20B, the dummy fins 22b and 22c are omitted from the area AR 21 of the standard cell 20C, and one end of each of the active fins 12b and 12c extends to reach the space left by omitting the dummy fins 22b and 22c. Likewise, the dummy fins 24b and 24c are omitted from the area AR22, and the other end of the active fins 12b and 12c extends to reach the space left by omitting the dummy fin 24b and 24c.

In FIG. 1, the standard cell 30 includes a plurality of active fins 31a, 31b, 31c, 32a, 32b, and 32c which extend in the lateral direction from one end portion to the other end portion and which are arranged in the vertical direction. That is to say, the active fins 31a, 31b, 31c, 32a, 32b, and 32c are arranged in the vertical direction along the boundary between the standard cells 30 and 20C.

As can be seen from the foregoing, according to this embodiment, in two standard cells adjacent to each other in the lateral direction, the fins of one standard cell that are arranged in the vertical direction along the boundary between these standard cells so as to be aligned with their associated fins of the other standard cell. Consequently, the distance between the fins that are adjacent to each other with the boundary between the associated standard cells interposed therebetween is defined uniquely, irrespective of the types of the adjacent standard cells. This allows for reducing a variation in characteristic to be caused due to a difference in type between the adjacent standard cells, and eventually improving the performance of a semiconductor device including the standard cells. In addition, this embodiment allows for reducing the margins to be left according to the capacitance and current characteristics of respective circuits of a semiconductor device, and consequently, minimizing an increase in cost.

Second Embodiment

Figure 5:
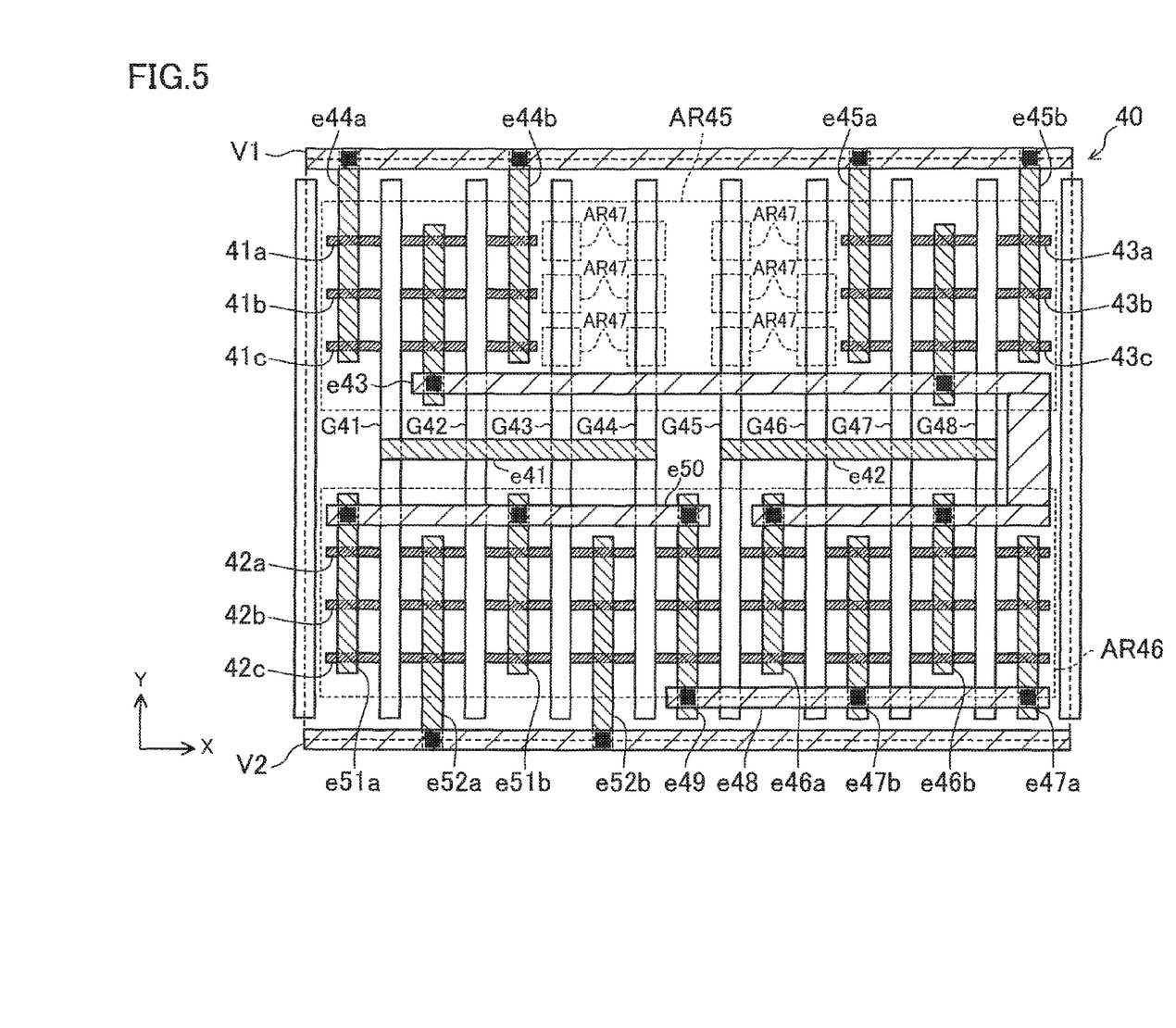
FIG. 5 is a plan view showing an exemplary layout design of a standard cell according to a second embodiment.

FIG. 5 is a plan view showing an exemplary layout design of a standard cell according to a second embodiment.

In FIG. 5, the reference characters AR45 and AR46 denote logical function areas in each of which a NAND cell comprised of fin transistors is arranged. The logical function area AR45 may function as a region of for example, a first conductivity type (e.g., p-type), and the logical function area AR46 may function as a region of, for example, a second conductivity type (e.g., n-type) that is different from the first conductivity type. In this embodiment, a standard cell 40 is supposed to have a rectangular shape, and each active transistor of a first channel type corresponding to the first conductivity type arranged in the logical function area AR45 is supposed to be smaller in size than each active transistor of a second channel type corresponding to the second conductivity type arranged in the logical function area AR46. In other words, the logical function region AR45 has non-active fin areas where fins may be arranged but no active fins are arranged. The reference character AR47 denotes those non-active fin areas. The cell of FIG. 5 includes twelve non-active fin areas in total. For example, in FIG. 5, the non-active fin areas are formed not only in the case described above. For example, the non-active fin area may also be formed due to the type of a logical function to be performed by the standard cell. For example, even if each active transistor of the first channel type has the same size as each active transistor of the second channel type in the logical function area AR46, a difference in the number of the transistors between the areas forms the non-active fin areas where no active fins are arranged. Further, non-active fin areas may also be formed depending on the number of the fins used in each active transistor.

The standard cell 40 includes a plurality of active fins (first active fins) 41a, 41b, and 41c which extend in the lateral direction from the left end portion to a point closer to the left end than the middle of the is, and which are arranged along the left end of the standard cell 40 in the vertical direction. The standard cell 40 further includes active fins (second active fins) 43a, 43b, and 43c which extend in the lateral direction from the right end portion to a point closer to the right end than the middle of the cell is and which are arranged along the right end of the standard cell 40 in the vertical direction. In this embodiment, the active fins 41a, 41b, and 41c are arranged in the vertical direction so as to be aligned with their associated active fins 43a, 43b, and 43c (for example, such that each of the active fins 41a, 41b, and 41c and the associated one of the active fins 43a, 43b, and 43c are arranged at substantially the some position in the vertical direction). As used herein, if some pair of members are "located substantially at the same position in the vertical direction", those members may be slightly misaligned with each other with respect to the vertical direction due to some error involved with a design or manufacturing process, for example. This is applicable also to the rest of the description.

Further, the standard cell 40 includes, in the logical function area AR46, a plurality of active fins 42a, 42b, and 42c which extend in the lateral direction from one end portion to the other end portion and which are arranged in the vertical direction.

In the standard cell 40, gate lines G41 to G48 extend in the vertical direction and are arranged at a predetermined pitch in the lateral direction. The gate lines G41 and G42 intersect, at right angles, with each of the active fins 41a, 41b, and 41c at their intermediate portion in the lateral direction. The gate lines G41 and G42 also intersect, at right angles, with each of the active fins 42a, 42b, and 42c at their portion close to the left end of the cell 40. The gate lines G43 to G46 extend without intersecting with any fins in the non-active fin areas AR47, AR47, . . . , and intersect with each of the active fins 42a, 42b, and 42c at their intermediate portion in the lateral direction in the logical function area AR46. The gate lines G47 and G48 intersect, at right angles, with each of the active fins 43a, 43b, and 43c at their intermediate portion in the lateral direction. The gate lines G47 and G48 also intersect, at right angles, with each of the active fins 42a, 42b, and 42c at their portion close to the right end of the cell 40. The gate lines G41 to G44 are connected to an input line e41 which extends in the lateral direction and through which an input signal A4 is applied. Likewise, the gate lines G45 to G48 are connected to an input line e42 which extends in the lateral direction and through which an input signal B4 is applied.

In the standard cell 40, an output line e43 through which an output signal Y4 is output is connected to the active fins 41a, 41b, and 41c, between the gate lines G41 and G42. Both end portions of each of the active fins 41a, 41b, and 41c in the lateral direction are connected to a power supply line V1 via connection lines e44a and e44b which extend in the vertical direction. Likewise, the output line e43 is also connected to the active fins 43a, 43b, and 43c, between the gate lines G47 and G48. Both end portions of each of the active fins 43a, 43b, and 43c in the lateral direction are connected to the power supply line V1 via connection lines e45a and e45b which extend in the vertical direction. An output line e43 is connected between the gate lines G45 and G46 and between the gate lines G47 and G48 to the active fins 42a, 42b, and 42c via the connection lines e46a and e46b extending in the vertical direction.

In the standard cell 40, the active fins 42a, 42b, and 42c are connected to each other at their respective portions between the right end and the gate line G48 via a connection line e47a which extends in the vertical direction, and at their respective portions between the gate lines G46 and G47 via a connection line e47b which extends in the vertical direction. The connection lines e47a and e47b are connected to connection lines e51a and e51b which extend in the vertical direction via a connection line e48 which extends in the lateral direction, a connection line e49 which extends in the vertical direction, and a connection line e50 which extends in the lateral direction. The connection line e51a is connected to an intermediate portion of each of the active fins 42a, 42b, and 42c between their left end and the gate line G41, and the connection line e51b is connected to an intermediate portion of each of the fins 42a, 42b, and 42c between the gate lines G42 and G43. Further, a portion of each of the active fins 42a, 42b, and 42c between the gate lines G41 and G42 and a portion of each of the active fins 42a, 42b, and 42c between the gate lines G43 and G44 are connected to a power supply line V2 via connection lines e52a and e52b, respectively, which both extend in the vertical direction.

As can be seen from the foregoing, if the non-active fin areas AR47, AR47, . . . are formed in the logical function area AR45, the active fin are preferentially arranged according to this embodiment along both ends of the standard cell 40 in the lateral direction. Likewise, in the logical function area AR46, the active fins are arranged along both ends of standard cell 40 in the lateral direction. If standard cells with such a configuration are arranged adjacent to each other in the lateral direction, the distance between the fins that are adjacent to each other with the boundary between the associated standard cells interposed therebetween is defined uniquely, irrespective of the types of the adjacent standard cells. This allows for reducing a variation in characteristic to be caused due to a difference in type between the adjacent standard cells, and eventually improving the performance of a semiconductor device including such standard cells.

In the second exemplary embodiment described above, no fins are arranged in the non-active fin areas AR47, AR47, . . . . This is, however, merely an example. Alternatively, dummy fins (not shown) which do not contribute to any logical function of the standard cell may be arranged in the areas AR47, AR47, . . . , for example. More specifically, those dummy fins may be configured as diode fins forming part of diode elements (e.g., antenna diodes), capacitive fins formed part of capacitive elements, or OFF-state transistor fins formed part of OFF-state transistors (non-active transistors), for example.

Further, in the exemplary embodiment described above, in the logical function area AR46, all of the three active fins 42a, 42b, and 42c extend in the lateral direction between both end portions of the standard cell 40. However, only one of the three active fins may extend between both end portions of the standard cell 40. In this case, it is recommended that the other two active fins be preferentially arranged along the right and left ends of the standard cell 40. Each active fin that extends between both end portions of the standard cell 40 does not have to be continuous over the entire area, but may be partially cut off on the way.

Third Embodiment

Figure 6:
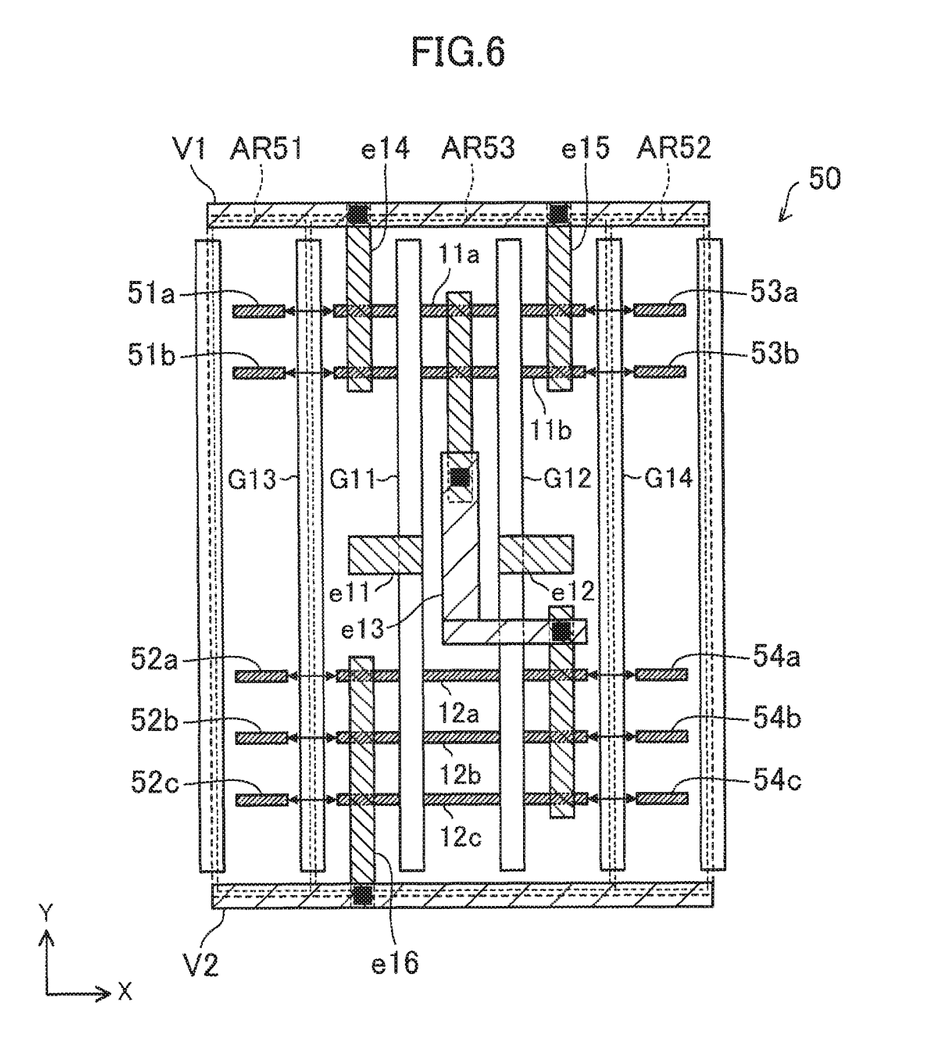
FIG. 6 is a plan view showing an exemplary layout design of a standard cell according to a third embodiment.

FIG. 6 is a plan view showing an exemplary layout design of a standard cell according to a third embodiment.

In FIG. 6, the reference character AR53 denotes a logical function area in which a NAND cell comprised of fin transistors is arranged. This NAND cell has a similar configuration to the standard cell 20A.

The standard cell 50 includes, in an area (i.e., area AR51) between the logical function area AR53 and one end (i.e., left end) in the lateral direction, a plurality of dummy fins (first dummy fins) 51a, 51b, 52a, 52b, and 52c which extend in the lateral direction and which are arranged in the vertical direction so as to be aligned with their associated active fins 11a, 11b, 12a, 12b, and 12c which form part of the NAND cell. The standard cell 50 also includes, in an area (i.e., area AR52) between the logical function area AR53 and the other end (i.e., right end) in the lateral direction, a plurality of dummy fins (second dummy fins) 53a, 53b, 54a, 54b, and 54c which extend in the lateral direction and which are arranged at such positions in the vertical direction as to be aligned with their associated active fins 11a, 11b, 12a, 12b, and 12c which form part of the NAND cell. Specifically, for example, each of the dummy fins 51a 51b, 52a, 52b, and 52c and each of the dummy fins 53a, 53b, 54a, 54b, and 54c are arranged at substantially the same position as the associated one of the active fins 11a, 11b, 12a, 12b, and 12c in the vertical direction. As used herein, if some pair of members are "located substantially at the same position in the vertical direction", those members may be slightly misaligned with each other with respect to the vertical direction due to some error involved with a design or manufacturing process, for example.

Thus, in the lateral direction, each active fin is interposed between a pair of its associated dummy fins that are respectively arranged near both ends of the cell. Therefore, irrespective of the type of a cell (for example, a standard cell) to be arranged adjacent to this standard cell, or no matter whether such a cell is arranged or not, the distance between each active fin and the adjacent fin (dummy fin) is defined uniquely. This allows for reducing a variation in characteristic between the active transistors in a logical function area, irrespective of the types of adjacent cells, and eventually improving the performance of a semiconductor device including the standard cells of this embodiment.

In this embodiment, each of the active fins in the logical function area AR53 is continuous in the lateral direction. This is, however, merely an example. Alternatively, the active fins may be partially cut off. Optionally, the standard cell 50 may include a plurality of active transistors which have different numbers of fins. In this case, it is recommended that all of the dummy fins in the areas AR51 and AR52 be arranged to be aligned with the active fins of all of the active transistors.

In the embodiment shown in FIG. 6, the dummy fins are arranged in the areas AR51 and AR52. The dummy fins, however, may be arranged only in one of the two areas (i.e., any one of the areas AR51 and AR52), for example. In a standard cell which is required to have high precision, such as a clock cell which contributes to supply and frequency division of a clock, it is still recommended that the dummy fins be arranged in the areas AR51 and AR52 located near both ends of the cell, as in the standard cell 50.

Other Embodiments

The first to third embodiments have been described as examples of the technique according to the present disclosure. However, the technique of the present disclosure is not limited to these embodiments, and is applicable to other embodiments to which modification, substitution, addition, and omission are made as appropriate, for example. Such embodiments will be described now.

FIGS. 7-10 are plan views showing other exemplary layout designs of a standard cell according to the present disclosure.

Figure 7:
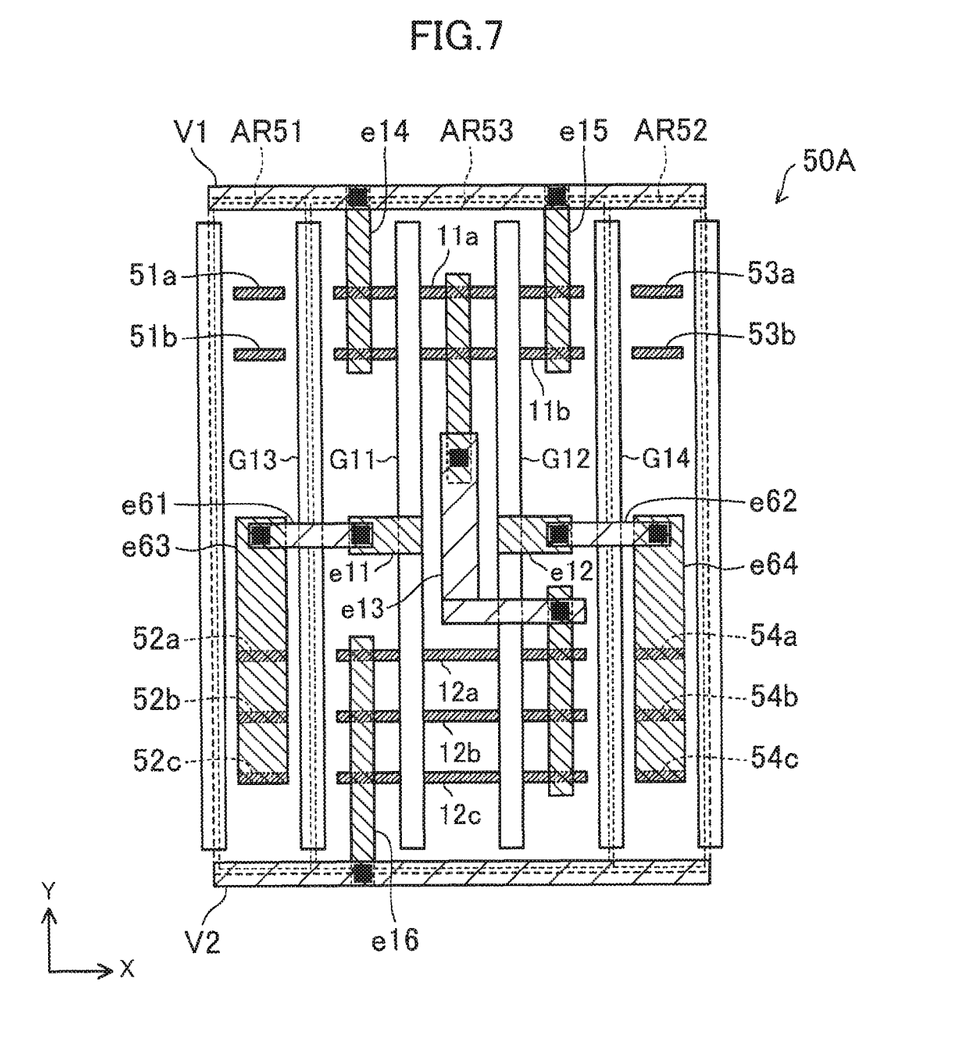
FIG. 7 is a plan view showing another exemplary layout design of a standard cell.

FIG. 7 shows a standard cell 50A which has a similar configuration to the standard cell 50 of FIG. 6, except that the dummy fins 52a, 52b, and 52c in the area AR51 and the dummy fins 54a, 54b, and 54c in the area AR52 are replaced with diode fins forming part of antenna diodes.

Specifically, the dummy fins (diode fins) 52a, 52b, and 52c in the area AR51 are connected to a connection line e63 which extends in the vertical direction, and to an input line e11 via a connection line e61 which extends in the lateral direction. The dummy fins (diode fins) 54a, 54b, and 54c in the area AR52 are connected to a connection line e64 which extends in the vertical direction, and to an input line e12 via a connection line e62 which extends in the lateral direction.

This configuration allows for connecting the antenna diodes to the input terminals of the NAND cell without increasing the circuit area of the standard cell 50. The antenna diodes may be connected to any portion other than the input terminals of the NAND cell. For example, each antenna diode may be connected to the input terminal of an adjacent standard cell, or to another input terminal provided, if any, inside the standard cell.

Figure 8:
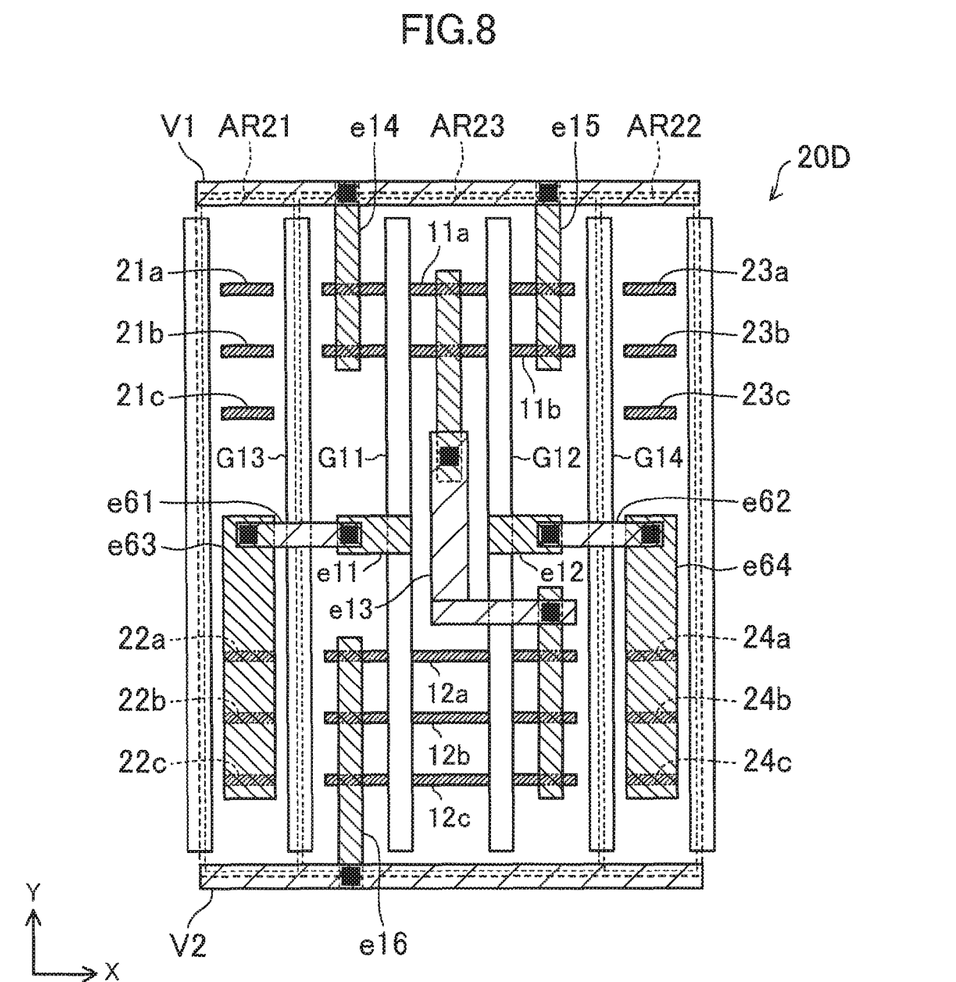
FIG. 8 is a plan view showing another exemplary layout design of a standard cell.

In the standard cell 20A, 20B, and 20C shown in FIGS. 2 to 4, at least one of the dummy fins may be replaced with an antenna diode. FIG. 8 shows a standard cell 20D which has a similar configuration to the standard cell 20A of FIG. 2, except that the dummy fins 22a, 22b, and 22c in the area AR21 and the dummy fins 24a, 24b, and 24c in the area AR22 are configured as diode fins forming part of antenna diodes.

Thus, as in the standard cell 50A of FIG. 7, this configuration allows for connecting the antenna diodes to the input terminals of the NAND cell without increasing the circuit area of the standard cell 20A.

Figure 9:
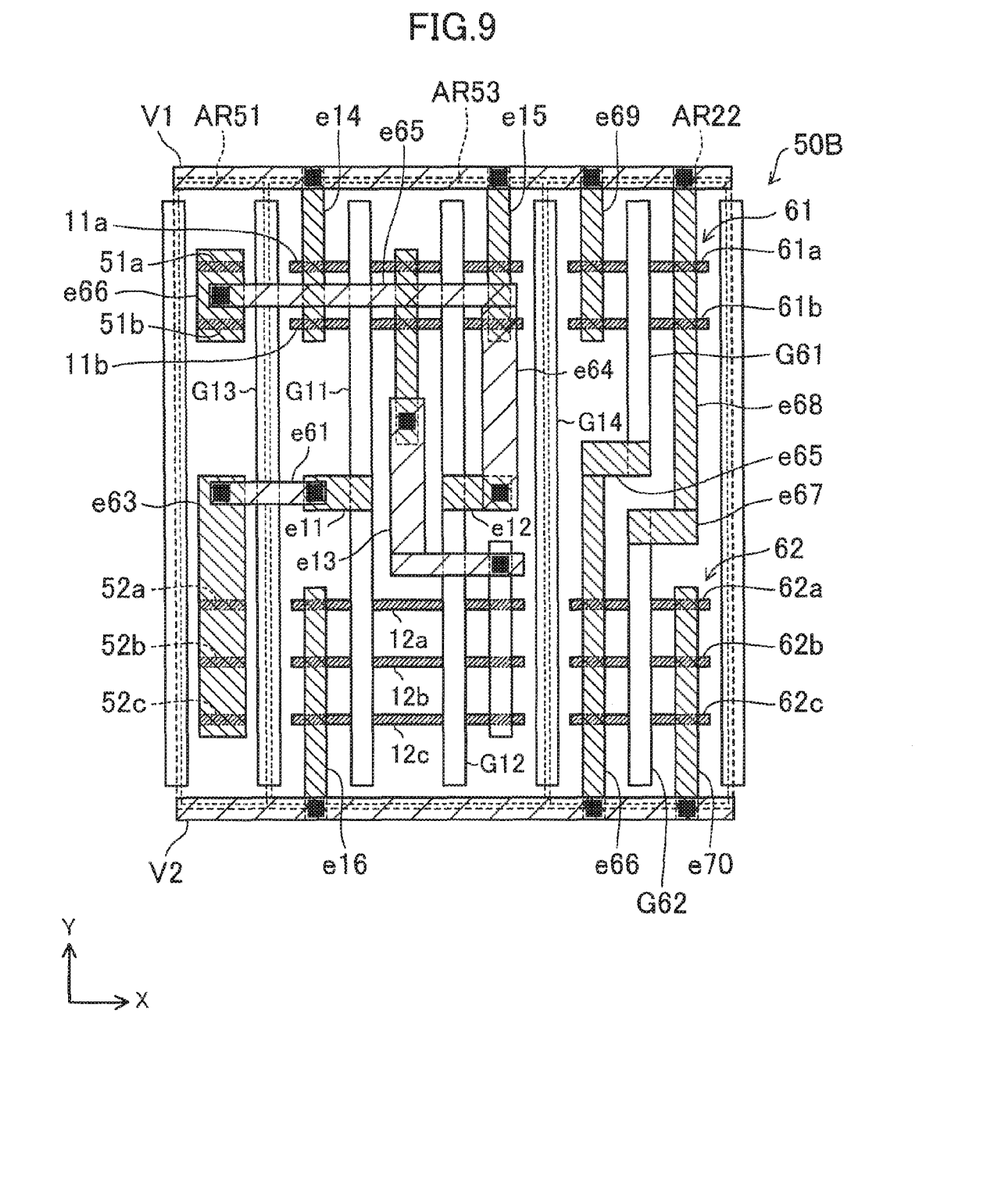
FIG. 9 is a plan view showing another exemplary layout design of a standard cell.

FIG. 9 shows a standard cell 50B which has a similar configuration to the standard cell 50 of FIG. 6, except that the dummy fin 51a, 51b, 52a, 52b, and 52c in the area AR51 are replaced with diode fins which form part of antenna diodes, and the dummy fins 53a, 53b, 54a, 54b, and 54c in the area AR52 are replaced with dummy fins (capacitive fins) 61a, 61b, 62a, 62b, and 62c which form part of capacitive elements 61 and 62.

Specifically, the dummy fins 51a and 51b in the area AR51 are connected to a connection line e66 which extends in the vertical direction, and to an input line e12 via connection lines e65 and e64 which extend in the lateral direction and the vertical direction, respectively. The dummy fins 52a, 52b, and 52c in the area AR51 are connected to a connection line e63 which extends in the vertical direction, and to an input line e11 via a connection line e61 which extends in the lateral direction.

In FIG. 9, the capacitive element 61 includes the dummy fins 61a, 61b and a gate line G61. The gate line G61 extends in the vertical direction and is arranged to intersect, at right angles, with each of the dummy fins 61a and 61b at their intermediate portion. Further, the gate line G61 is also connected to a power supply line V2 via connection lines e65 and e66 which extend in the lateral direction the vertical direction, respectively. Both end portions of each of the dummy fins 61a and 61b in the lateral direction are connected to a power supply line V1 via connection lines e68 and e69 which extend in the vertical direction.

Likewise, the capacitive element 62 includes the dummy fins 62a, 62b, 62c and a gate line G62. The gate line G62 extends in the vertical direction, and is arranged to intersect, at right angles, with each of the dummy fins 62a, 62b, and 62c at their intermediate portion. The gate line G62 is connected to the power supply line V1 via a connection line e67 which extends in the lateral direction and the connection line e68. Both end portions of each of the dummy fins 62a, 62b, and 62c in the lateral direction are connected the power supply line V2 via a connection line e70 which extends in the vertical direction and the connection line e66.

This configuration allows for reducing an increase in the circuit area to be caused by the addition of the capacitive elements to the standard cell 50. In the standard cell 20A, 20B, and 20C of FIGS. 2 to 4, at least one of the dummy fins may be replaced with a capacitive fin which forms part of a capacitive element, as in FIG. 9.

Figure 10:
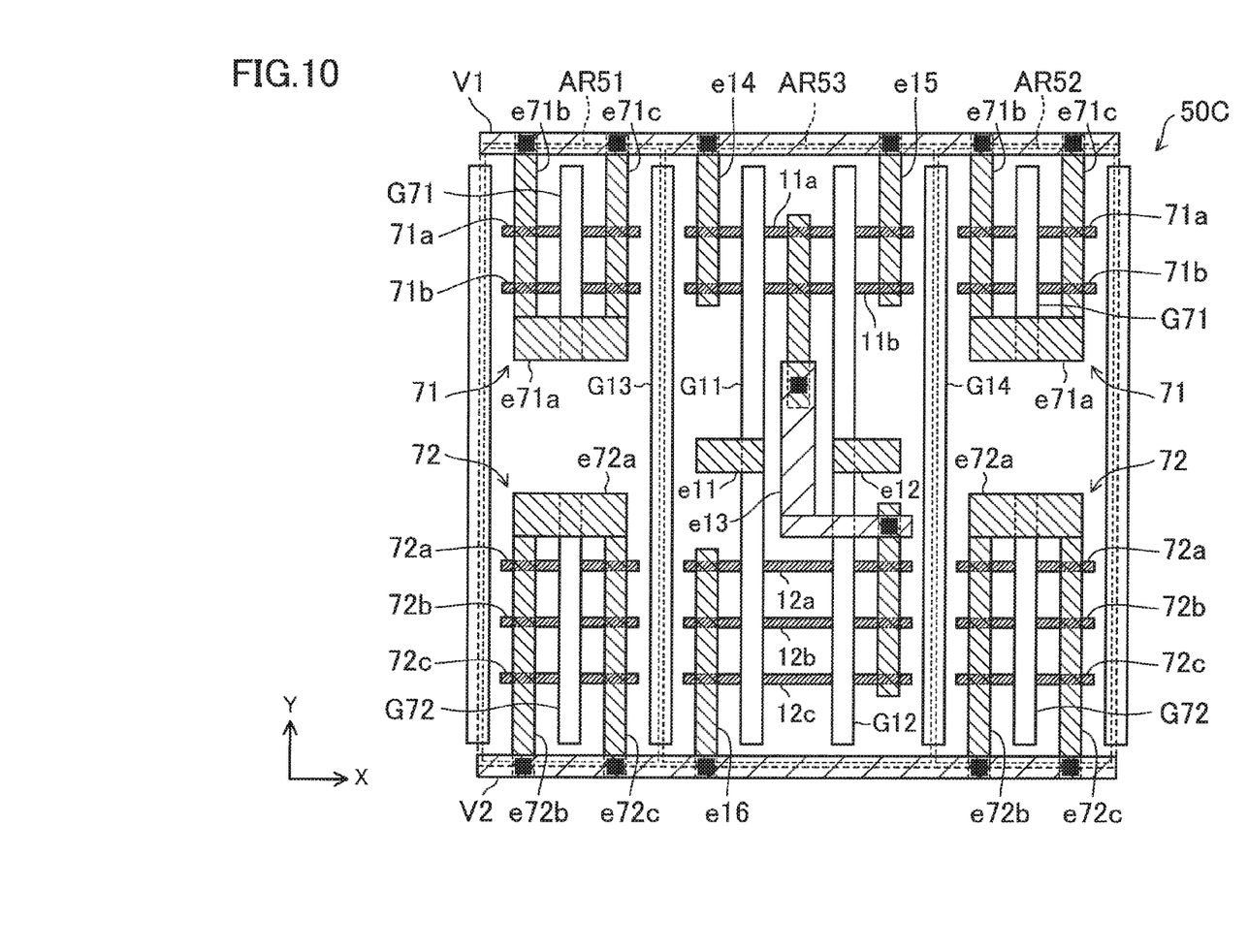
FIG. 10 is a plan view showing another exemplary layout design of a standard cell.

FIG. 10 shows a standard cell 50C which has a similar configuration to the standard cell 50 of FIG. 6, except that OFF-state transistors 71 and 72 are arranged in each of the areas AR51 and AR52.

In the standard cell 50C, each OFF-state transistor 71 includes dummy fins (OFF-state transistor fins) 71a, 71b and a gate line G71. The dummy fins 71a and 71b extend in the lateral direction, and are arranged in the vertical direction so as to be aligned with their associated active fins 11a and 11b. The gate line G71 is connected to a connection line e71a which extends in the lateral direction. Both end portions of each of the dummy fins 71a, 71b and connection line e71a in the lateral director are connected to a power supply line V1 via connection lines e71b and e71c which extend in the vertical direction. Each OFF-state transistor 72 includes dummy fins (OFF-state transistor fins) 72a, 72b, 72c and a gate line G72. The dummy fins 72a, 72b, and 72c extend in the lateral direction, and are arranged in the vertical direction so as to be aligned with their associated active fins 12a, 12b, and 12c. The gate line G72 is connected to a connection line e72a which extends in the lateral direction. Both end portions of each of the dummy fins 72a, 72b, 72c and connection line e72a in the lateral direction are connected to a power supply line V2 via connection lines e72b and e72c which extend in the vertical direction.

This configuration allows for reducing an increase in the circuit area to be caused by the addition of the OFF-state transistors to the standard cell 50. In the standard cells 20A, 20B, and 20C of FIGS. 2 to 4, at least one of the dummy fins may be replaced with an OFF-state transistor fin which forms part of an OFF-state transistor, as in FIG. 10.

The present disclosure provides a semiconductor device capable of reducing a variation in characteristic (for example, a variation in current characteristic or capacitance characteristic) to be caused due to a difference in type between standard cells arranged laterally adjacent to each other. Thus, the present disclosure is useful for improvement in the performance of semiconductor devices for use in various electronic devices.

What is claimed is:

1. A semiconductor device comprising first and second standard cells which are arranged adjacent to each other in a first direction and which each include a fin transistor, wherein the first standard cell includes a plurality of first fins which extend in the first direction, and which are arranged along a boundary between the first and second standard cells in a second direction that is perpendicular to the first direction, the second standard cell includes a plurality of second fins which extend in the first direction, and which are arranged in the second direction along the boundary between the first and second standard cells such that each of the plurality of second fins is aligned with an associated one of the plurality of first fins, the second standard cell further includes at least one active fin different from the plurality of first fins and the plurality of second fins, and at least one of the plurality of second fins is at least one dummy fin which does not contribute to any logical function.

2. The semiconductor device of claim 1, wherein all of the plurality of second fins are the dummy fins.

3. The semiconductor device of claim 1, wherein at least one of the at least one dummy fin is configured as a diode fin forming part of an antenna diode.

4. The semiconductor device of claim 3, wherein the antenna diode has an input terminal connected to an input terminal of at least one of active transistors which contribute to the logical function of the first and second standard cells.

5. The semiconductor device of claim 1, wherein at least one of the at least one dummy fin is configured as a capacitive fin forming part of a capacitive element.

6. The semiconductor device of claim 1, wherein at least one of the at least one dummy fin is configured as an OFF-state transistor fin forming part of an OFF-state transistor.

7. A semiconductor device comprising a standard cell including a fin transistor, wherein the standard cell further includes:

a plurality of first active fins which extend in a first direction, and which are arranged in a second direction that is perpendicular to the first direction along one end of the standard cell in the first direction, a plurality of second active fins which extend in the first direction, and which are arranged in the second direction along the other end of the standard cell in the first direction, and two regions having two different conductivity types which are arranged adjacent to each other in the second direction, wherein the first active fins and the second active fins are arranged in both the two regions having the two different conductivity types, in one of the two regions that has one of the two conductivity types, a third active fin is arranged between at least one pair of the first and second active fins, and in the other region that has the other conductivity type, a non-active fin area where no active fins are arranged at the same position as the third fin in the first direction is provided.

8. The semiconductor device of claim 7, wherein a dummy fin which does not contribute to any logical function is arranged in the non-active fin area.

* * * * *